United States Patent
Liu

(10) Patent No.: US 11,183,591 B2
(45) Date of Patent: Nov. 23, 2021

(54) LATERAL DOUBLE-DIFFUSED METAL-OXIDE-SEMICONDUCTOR (LDMOS) FIN FIELD EFFECT TRANSISTOR WITH ENHANCED CAPABILITIES

(71) Applicant: Avago Technologies International Sales Pte. Ltd., Singapore (SG)

(72) Inventor: Qing Liu, Irvine, CA (US)

(73) Assignee: Avago Technologies International Sales Pte. Ltd., Singapore (SG)

( * ) Notice: Subject to any disclaimer, the term of this patent is extended or adjusted under 35 U.S.C. 154(b) by 92 days.

(21) Appl. No.: 16/669,193

(22) Filed: Oct. 30, 2019

(65) Prior Publication Data

US 2021/0135006 A1   May 6, 2021

(51) Int. Cl.
  *H01L 21/00*   (2006.01)
  *H01L 29/78*   (2006.01)
  *H01L 29/06*   (2006.01)
  *H01L 29/66*   (2006.01)

(52) U.S. Cl.
  CPC ...... *H01L 29/7817* (2013.01); *H01L 29/0653* (2013.01); *H01L 29/66681* (2013.01); *H01L 29/66795* (2013.01); *H01L 29/785* (2013.01)

(58) Field of Classification Search
  CPC ..... H01L 21/823418; H01L 21/823431; H01L 21/823481; H01L 21/823814; H01L 21/823821; H01L 21/823878; H01L 27/0886; H01L 29/0649; H01L 29/0653; H01L 29/41775; H01L 29/41783; H01L 29/41791; H01L 29/66681; H01L 29/66795; H01L 29/7817; H01L 29/785; H01L 29/7851
  See application file for complete search history.

(56) References Cited

U.S. PATENT DOCUMENTS

| | | | |
|---|---|---|---|
| 8,283,231 B2 * | 10/2012 | Merelle | H01L 27/088 438/276 |
| 8,779,527 B2 * | 7/2014 | Merelle | H01L 21/823418 257/391 |
| 9,041,115 B2 * | 5/2015 | Liaw | H01L 27/0207 257/369 |
| 9,048,122 B2 * | 6/2015 | Merelle | H01L 27/0886 |
| 9,082,751 B2 | 7/2015 | Chen et al. | |
| 9,105,719 B2 | 8/2015 | Ito | |
| 9,209,202 B2 | 12/2015 | Ponoth et al. | |
| 9,379,236 B2 | 6/2016 | Ponoth et al. | |
| 9,472,615 B2 | 10/2016 | Zhang et al. | |
| 9,478,542 B1 | 10/2016 | Ito | |

(Continued)

*Primary Examiner* — Laura M Menz
(74) *Attorney, Agent, or Firm* — Foley & Lardner LLP

(57) ABSTRACT

A fin-shaped field-effect transistor (finFET) device is provided. The finFET device includes a substrate material with a first surface and a bottom surface. The finFET device also includes a well region formed in the substrate material. The well region may include a first type of dopant. The finFET device also includes a fin structure disposed on the first surface of the substrate material. A portion of the fin structure may include the first type of dopant. The finFET device also includes an oxide material disposed on the first surface of the substrate material and adjacent to the portion of the fin structure. The finFET device also includes a first epitaxial material disposed over a portion of the fin structure. The first epitaxial material may include a second type of dopant.

20 Claims, 3 Drawing Sheets

(56) References Cited

U.S. PATENT DOCUMENTS

| | | | |
|---|---|---|---|
| 9,502,419 B2* | 11/2016 | Liaw | H01L 27/1116 |
| 10,199,279 B2* | 2/2019 | You | H01L 21/823821 |
| 10,205,024 B2* | 2/2019 | Cheng | H01L 29/6681 |
| 10,262,994 B2* | 4/2019 | Liu | H01L 29/0886 |
| 10,396,159 B2* | 8/2019 | Liu | H01L 27/0886 |
| 10,424,662 B2* | 9/2019 | Zhou | H01L 21/823821 |
| 10,505,020 B2* | 12/2019 | Liu | H01L 29/7825 |
| 10,971,622 B2* | 4/2021 | Liu | H01L 29/7817 |
| 2013/0285153 A1* | 10/2013 | Lee | H01L 21/02532 |
| | | | 257/369 |
| 2013/0292777 A1* | 11/2013 | Liaw | G11C 11/419 |
| | | | 257/369 |
| 2014/0065782 A1* | 3/2014 | Lu | H01L 21/76224 |
| | | | 438/294 |
| 2015/0255462 A1* | 9/2015 | Liaw | H01L 27/0924 |
| | | | 257/369 |
| 2015/0279995 A1* | 10/2015 | Maeda | H01L 21/823437 |
| | | | 257/192 |
| 2015/0311342 A1* | 10/2015 | Lin | H01L 29/66659 |
| | | | 257/190 |
| 2016/0020150 A1* | 1/2016 | You | H01L 29/165 |
| | | | 438/218 |
| 2017/0098648 A1* | 4/2017 | Lee | H01L 27/1211 |
| 2017/0229570 A1* | 8/2017 | Cheng | H01L 29/7835 |
| 2017/0352663 A1* | 12/2017 | Zhou | H01L 21/31144 |
| 2018/0047636 A1* | 2/2018 | You | H01L 21/823821 |
| 2018/0108755 A1* | 4/2018 | Liu | H01L 29/7835 |
| 2018/0122704 A1* | 5/2018 | Zhou | H01L 21/823437 |
| 2018/0138174 A1* | 5/2018 | Min | H01L 21/31111 |
| 2018/0308841 A1* | 10/2018 | Liu | H01L 27/0886 |
| 2019/0027473 A1* | 1/2019 | Chen | H01L 21/823431 |
| 2019/0131402 A1* | 5/2019 | Liu | H01L 29/42356 |
| 2019/0164809 A1* | 5/2019 | Meyer | H01L 21/28568 |
| 2019/0189793 A1* | 6/2019 | Cheng | H01L 29/402 |
| 2019/0333995 A1* | 10/2019 | Liu | H01L 29/0653 |
| 2019/0371933 A1* | 12/2019 | Chen | H01L 21/823878 |
| 2020/0075606 A1* | 3/2020 | Liaw | G11C 11/412 |
| 2020/0090995 A1* | 3/2020 | Choi | H01L 29/0847 |
| 2020/0111780 A1* | 4/2020 | Liu | H01L 27/1207 |
| 2020/0111905 A1* | 4/2020 | Liu | H01L 29/407 |
| 2020/0119001 A1* | 4/2020 | Shu | H01L 29/518 |
| 2020/0258982 A1* | 8/2020 | Glass | H01L 29/775 |
| 2021/0135006 A1* | 5/2021 | Liu | H01L 29/7851 |

\* cited by examiner

LATERAL DOUBLE-DIFFUSED METAL-OXIDE-SEMICONDUCTOR (LDMOS) FIN FIELD EFFECT TRANSISTOR WITH ENHANCED CAPABILITIES

TECHNICAL FIELD

The present description relates generally to transistors, including but not limited metal-oxide-semiconductor (MOS) fin-based field effect transistor (finFET) devices (e.g., lateral double-diffused metal-oxide-semiconductor (LDMOS) fin-FET devices).

BACKGROUND

Integrated circuits (ICs) include microprocessors, microcontrollers, static random access memory (RAM), communication circuits, digital logic circuits other circuits and combinations of those circuits fabricated on a substrate. The ICs include devices such as transistors. As IC devices continue scaling to smaller dimensions, various designs and techniques are employed to improve device performance. Fin-based structures, such as fin-shaped, field effect transistor (FinFET) structures as are an alternative to planar metal-oxide-semiconductor field-effect transistor (MOSFET) structures and can provide improved scalability. Fin-based fabrication techniques may be employed to create non-planar structures on a semiconductor substrate material (e.g., silicon), which may increase device density because the channel, source, and/or drain are raised out of the semiconductor substrate material in the form of a fin.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
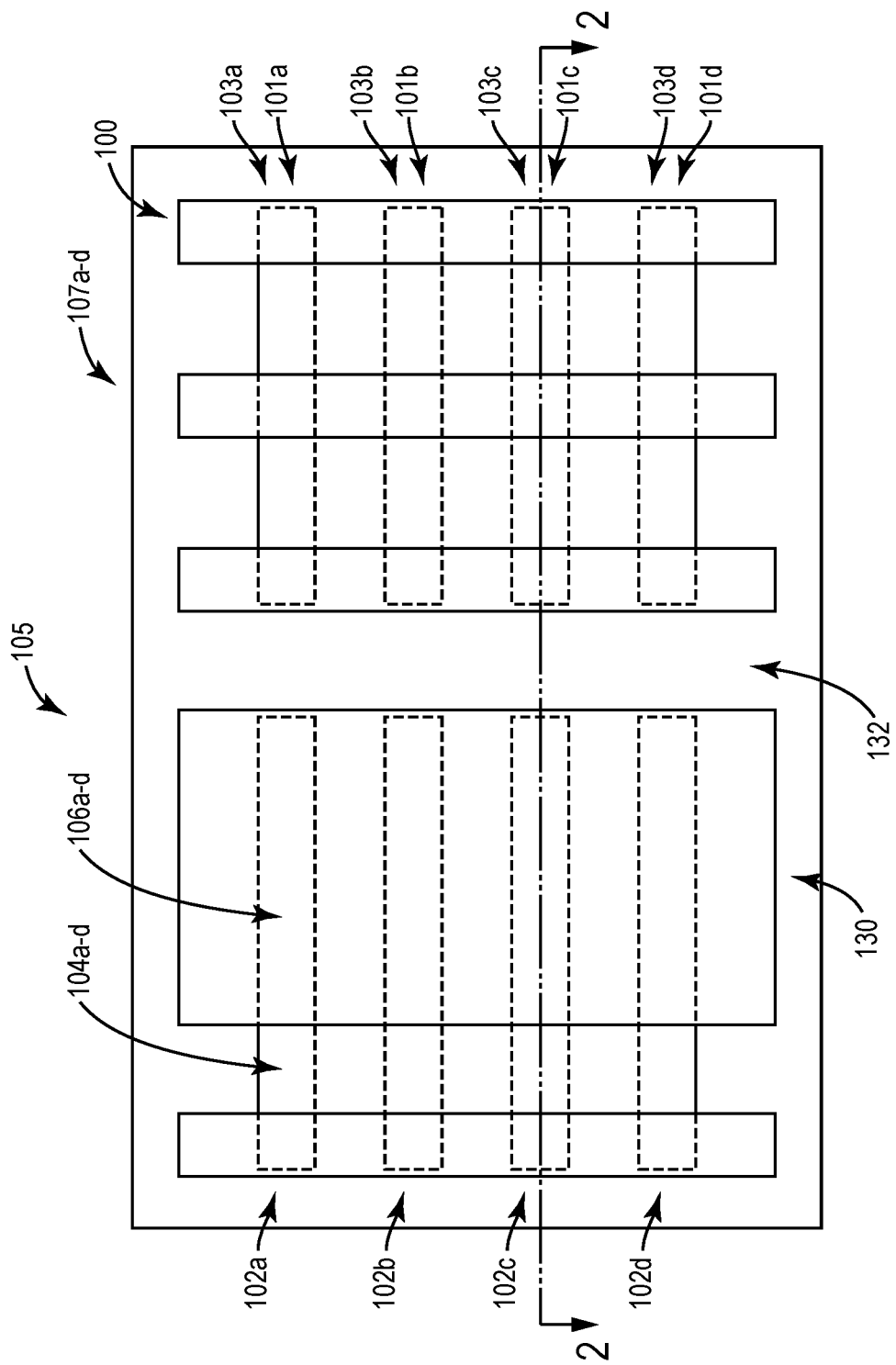
FIG. 1 is a planar top view of a finFET device in accordance with some embodiments.

Before turning to the features, which illustrate the exemplary embodiments in detail, it should be understood that the application is not limited to the details or methodology set forth in the description or illustrated in the figures. It should also be understood that the terminology is for the purpose of description only and should not be regarded as limiting.

In some embodiments, finFET devices are provided with LDMOS structures (e.g., super junction LDMOS structures). The LDMOS structures include multiple alternating regions of n- and p-type doped semiconductor in some embodiments. In some embodiments, a structure and fabrication flow allows for smaller devices that can be operated at higher voltages and have lower on-resistance ($R_{on}$). In some embodiments, the architecture of a finFET device provides compatibility with existing finFET-based complementary MOS (CMOS) device fabrication process flows, including smaller technologies such as 7 nm, 14 nm and 16 nm technologies. In some embodiments, a double drain FinFET is fabricated using a 7 nm process. No additional mask steps or process steps are needed to provide the double drain structures in some embodiments.

In some embodiments, the finFET structure and fabrication flow of operations therefor advantageously reduces adverse effects associated with tighter fin pitches of finFET technology scaled to smaller sizes (e.g., 7 nanometer (nm) or less). A tighter fin pitch can result in thinner fins which degrades performance especially when raised source/drain epitaxial (EPI) processes are used. Therefore, as smaller scale processes are developed, a larger silicon (Si) area may be required for finFETs of similar characteristics. In some embodiments, an enhanced double drain structure improves overall performance for FinFETs fabricated using smaller scale processes. One or more of higher drive current (greater than 30 percent), longer hot carrier injection (HCI) life time, and/or lower resistance ($R_{on}$) of greater than 20 percent) is achieved using the double drain structure in some embodiments. In some embodiments, the double drain structure is comprised of two doped regions (active regions (OD)) with epitaxial structures which provide improved resistance reduction, lower electric field and less current crowding. With an enhanced dual drain structure, the HCI lifetime is enhanced by 100 times over conventional single drain structures due to the lower electric field from less current crowding effect achieved by the structure in some embodiments. The LDMOS structures may be provided, for example, in integrated circuits that utilize 1.8V, 3.3 V and 5.0 V input/output (I/O) operating voltages and not have the disadvantages associated with tighter fin pitch of certain finFETs.

In some embodiments, epitaxial regions are formed above the drain and source regions in the fin structure. The source is provided on a first portion of the fin structure, and the drain is provided on a second portion of the fin structure in some embodiments. The first portion is separated from the second portion, and a shallow trench isolation region is disposed between the first portion and the second portion. In some embodiments, a first well region is formed in the substrate doped with a first type of dopant, and a second well region is formed in the substrate doped with a second type of dopant. A border between the first well region and the second well region is below the second portion and a gate structure.

Some embodiments relate to a finFET device including a substrate material having a first surface and a bottom surface, a first fin structure disposed on the first surface of the substrate material. The first fin structure includes a first portion and a second portion, at least one gate structure disposed over at least part of the first portion; a first drain/source region disposed in the first portion, a second source/drain region disposed in the second portion, and a third source/drain region disposed in the second portion. The first portion is separate from the second portion.

In some embodiments, the finFET device includes a first epitaxial material that is disposed above the first drain/source region, a second epitaxial material that is disposed above the second drain/source region, and a third epitaxial material that is disposed above the third drain/source region. In some embodiments, the first portion is above a first area of the substrate and the second portion is above a second area of the substrate. The first area is separated from the second area by a trench isolation structure. In some embodiments, the finFET device includes a first well region formed in the substrate doped with a first type of dopant, and a second well region formed in the substrate doped with a second type of dopant. A border is between the first well region and the second well region is below the second portion and the gate structure.

Some embodiments relate to a finFET device including a semiconductor substrate material and a first fin structure disposed above a first surface of the semiconductor substrate material. The first fin structure includes a first drain/source region disposed in a first end portion of the first fin structure, a second source/drain region disposed in a second end portion of the first fin structure, and a third source/drain region disposed in the second end portion. The finFET device includes at least one gate structure disposed over at least part of the first fin structure at a location closer to the first end portion than the second end portion, a first epitaxial material disposed over the drain/source region, a second epitaxial material disposed over the second drain/source region, and a third epitaxial material disposed over the third drain/source region.

In some embodiments, the finFET device includes a trench isolation structure disposed in the semiconductor substrate material between the first end portion and the second end portion. In some embodiments, the finFET device includes two gate conductors.

Some embodiments relate to a method of fabricating a finFET device. The method includes providing a fin structure above a substrate having a first surface. The fin structure includes a first portion and a second portion. The first portion is separated from the second portion. The semiconductor substrate material has the first surface and a bottom surface. The method further includes providing a first drain/source region in the first portion, providing a second source/drain region in the second portion, and providing a third source/drain region in the second portion.

In some embodiments, the method also includes providing a first well region formed in the substrate doped with a first type of dopant, and providing a second well region formed in the substrate doped with a second type of dopant. In some embodiments, the method also includes providing isolation material in a trench in the substrate between the first portion and the second portion.

With reference to FIG. 1, a finFET device 100 includes one or more fins 101a-d extending from left to right in FIG. 1. The number of fins 101a-d can be any number (e.g., from 1 to 20 or more depending upon system requirements and device characteristics). Lower $R_{on}$ and higher current requirements can utilize more fins 101a-d in some embodiments. Not all of the depicted components in FIG. 1 are necessary for all embodiments, and one or more embodiments may include additional components not shown in FIGS. 1 and 2. Variations in the arrangement and types of the components may be made without departing from the spirit or scope of the claims as set forth herein. Additional, different, or fewer components may be provided without departing from the architecture and fabrication techniques discussed herein.

The finFET device 100 includes or is provided on or in a substrate 105. The fins 101a-d each include a respective first portion 102a-d and a respective second portion 103a-d. The fins 101a-d are disposed above a first surface (a top surface of the substrate 105) at a bottom of the fins 101a-d. In some embodiments, the first portions 102a-d are associated with a respective source 104a-d and channel portion 106a-d disposed in the portions 102a-d and the second portions 103a-d are associated with a respective drain 107a-d. The sources 104a-d and the drains 107a-d can be interchanged in some embodiments. The drains 107a-d are double drain structures in some embodiments. The finFET device 100 can be an N-channel or P-channel device in some embodiments. The terms source/drain and drain/source can refer to either source or drain regions. Portions 102a-d and 103a-d are 100-500 nanometers long in some embodiments. In some embodiments, portions 103a-d are 110% to 300% longer than portions 102a-d.

Figure 2:
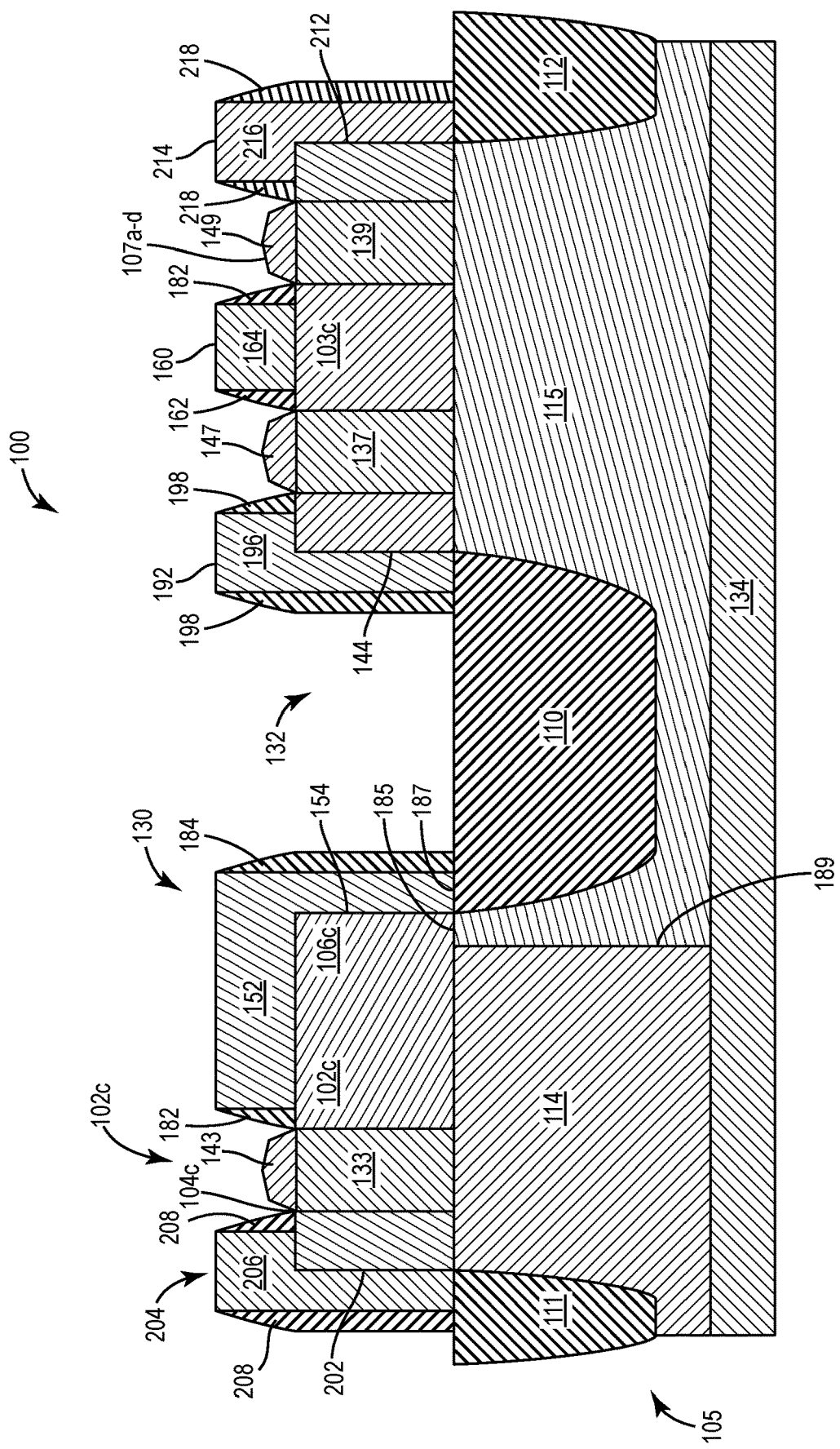
FIG. 2 is a cross-sectional view of the finFET device illustrated in FIG. 1 along a line 2-2 in a direction parallel to fin length, in accordance with some embodiments.

With reference to FIGS. 1 and 2, the substrate 105 includes the finFET device 100 which includes a dielectric material 110, a dielectric material 111, a dielectric material 112, a well region 114, a well region 115, the portions 102a-d (only portion 106c is shown in FIG. 2), the portions 103a-d (only portion 107c is shown in FIG. 2), a gate 130, and a gap 132. The gap 132 is above the dielectric material 110 which is a shallow trench isolation (STI) region in some embodiments. The dielectric material 111 and 112 are STI regions in some embodiments. In some embodiments, the dielectric material 110, 111, and 112 are deep trench isolation regions or local grown isolation regions. The dielectric material 110, 111, and 112 is silicon dioxide in some embodiments.

The sources 104a-d include highly doped regions (N-type), such as a respective region 133 (FIG. 2), in some embodiments. The drains 107a-d includes highly doped regions (N-type), such as respective regions 137 and 139 which form a double drain OD, in some embodiments. Regions 133, 137, and 139 are epitaxial doped regions (e.g. in-situ doped Phosphorous) in some embodiments. In some embodiments, the region 133 includes a doped epitaxial region 143 (e.g., N-type), and the regions 137 and 139 each include a respective doped epitaxial region 147 and 149 (e.g., N-type). Regions 137 and 139 are disposed in or above the portions 103a-d and the regions 133 are disposed in or above the portions 102a-d.

The substrate 105 includes a silicon substrate (e.g., lightly dope boron layer) that is doped to form well regions 114 and 115 which may have different doping (e.g., different type of dopants). Well region 114 is a P-well, and well region 115 is an N-well in some embodiments. A layer 134 is below the well regions 114 and 115 and is a lightly doped P-type region in some embodiments.

In some embodiments, the substrate 105 may be a p-type substrate; the well region 114, and the epitaxial regions 143, 147, and 149 include n-type dopants; and the well region 115 includes p-type dopants. The finFET device 100 formed from such an arrangement of the p-type and n-type regions may be referred to as a super junction n-type LDMOS (NLDMOS) device with an associated NLDMOS doping profile with a double drain. The well region 115 (e.g., a p-well drift region) may be depleted by the adjacent n-regions (e.g., the well region 114). For a PLDMOS device, the p-type and the n-type regions are reversed from that previously described (e.g., the well region 114 is doped with n-type dopants, the regions 133, 137, and 139 are P-type, and so forth). In one or more implementations, the well region 115 may have a doping concentration lower than a doping concentration of the epitaxial regions 143, 147, and 149. The substrate 105 may have a doping concentration lower than that of the well regions 114 and 115

For p-type doping, boron may be utilized as the dopant material. For n-type doping, phosphorus or arsenic may be utilized as the dopant material. Doping concentration for the well regions 115 and/or 114 may be between $10^{18}$ cm$^{-3}$ and $10^{19}$ cm$^{-3}$. Doping concentration for the epitaxial regions 143, 147, and 149 may be between $10^{20}$ cm$^{-3}$ and $10^{21}$ cm$^{-3}$.

The dopant materials and doping concentrations are provided by way of non-limiting example, and other dopant materials and doping concentrations may be utilized. The type of dopant (e.g., p-type, n-type), dopant material, and doping concentration may be selected based on, for instance, device characteristics such as threshold voltage requirements.

In some embodiments, a source contact and a drain contact may be coupled to the epitaxial region 143 and the epitaxial regions 147 and 149, respectively. The gate 130 is disposed over three sides of portions 102a-d of fins 101a-d between the epitaxial region 143 and an end 154. The use of two drain regions 137 and 139 advantageously provides two OD regions with epitaxial regions 147 and 149 which results in improved resistance reduction, lower electric field, and less current crowding.

Example bias voltages applied to the source contact, the gate 130 and the drain contact may be 0 V, 1.8 V, 1.8 V, and 3.3 V, respectively. In one or more implementations, the gate 130 may be biased to deplete a channel below the gate 130. In one or more implementations, on the drain side, the epitaxial region 143 may allow for depletion of the portions 106a-d of the portions 102a-d. A channel path is provided from the sources 104a-d through the portions 106a-d under the dielectric material 110 in the well region 115 to the drains 107a-d.

The drain regions 137 and 139 are separated in the portions 103a-d, and the epitaxial regions 147 is separated from the epitaxial region 149 by a dummy gate structure 160 including a spacers 162 and a dummy gate material 164. An end 202 of the portions 102a-d is covered by a dummy gate structure 204 including a dummy gate material 206 and spacers 208. The dummy gate structure 204 is provided over the dielectric material 111. An end 212 of portions 103a-d is covered by a dummy gate structure 214 including dummy gate material 216 and spacers 218. The dummy gate structure 214 is provided above or adjacent dielectric material 112. Gap 132 and material above the gate 130 can be filled with dielectric material.

Gap 132 is defined by the gate 130 which includes a spacer 182 and a spacer 184 and a gate structure 192. The gate structure 192 is provided over an end 144 of the portions 103a-d and includes a gate conductor 196 and spacers 198. The spacers 208, 182, 184, 198, 162, and 218 and associated dummy gate material and confine ends or sides of the fins 101a-d to protect from lateral and other growth during epitaxy.

The gate 130 includes a gate conductor 152 and a gate conductor 196. The gate conductors 152 and 196 can be a metal material or a doped polysilicon material. Gate conductor 152 is provided over an end 154 of portions 102a-d and is provided above a first surface 185 of the substrate 105 at a portion 187. The gate conductor 152 can cover four sides of the portions 102a-d (e.g., end 154) and three sides of the fin 101C not in contact with the surface 185 of the substrate 105. Gate conductor 196 is provided over an end 144 of portions 103a-d and over three sides of the portions 103a-d at the end 144. The gate conductor 196 is provided above a first surface 185 of the substrate 105 near the end 144.

The gate 130 (gate conductor 152) is provided above a boundary 189 between the well regions 114 and 115. Spacers 182 and 184 and the spacers 218, 162, 198, and 208 are dielectric material, such as silicon dioxide, silicon nitride, etc. The gate 130 may include a gate oxide material, a gate dielectric material, and a work function metal. For explanatory purposes, the oxide material, dielectric material, and work function metal are not shown in FIG. 2.

Figure 3:
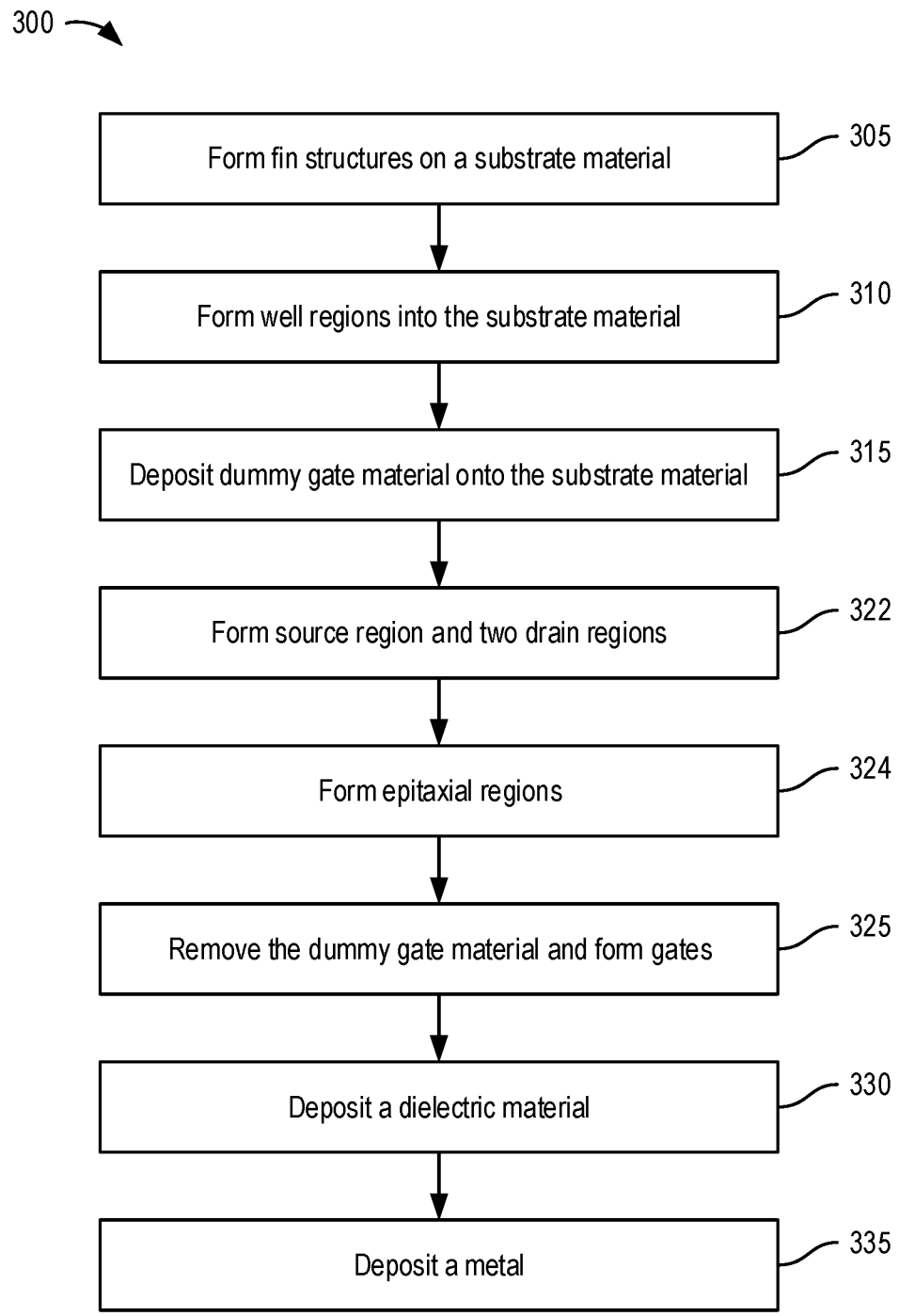
FIG. 3 illustrates a flow diagram of exemplary fabrication operations for forming a finFET device in accordance with some embodiments.

FIG. 3 illustrates a flow diagram of an example fabrication flow 300 for forming a finFET device in accordance with one or more implementations. The operations of flow 300 do not need to be performed in the order shown. It is understood that the depicted order is an illustration of one or more example approaches, and are not meant to be limited to the specific order or hierarchy presented. For example, based on preferences and/or specifications (e.g., cost, available materials, performance specifications), the specific order or hierarchy of the blocks may be rearranged or adjusted, and some operations may be removed while others may be added. Two or more of the operations can be performed simultaneously. In one or more implementations, the flow 300 may be utilized to form the finFET device 100 described with respect to FIGS. 1 and 2. Other finFET devices in accordance with one or more implementations may be formed by the flow 300. Other flows in accordance with one or more implementations can be realized to form the finFET device 100.

For explanatory purposes, the example flow 300 is primarily described herein with reference to FIGS. 1-2. One or more fin structures (e.g., fins 101a-d) are formed on the substrate 105 in an operation 305. In some embodiments, the fin structures may be formed using spacer lithography. In some embodiments, the fin structures are provided in a semiconductor layer above a substrate, formed by etching the substrate, grown on the substrate, or otherwise formed. The fin pitch $p_{fin}$ may be measured from a point on one fin structure to the same point on another fin structure (e.g., an adjacent fin structure). A fin length L (from left to right in FIG. 1) may be in the tens of microns or less in some embodiments. The substrate 105 can be a bulk substrate or a silicon-on-insulator substrate. The fin height is 40-50 nanometers. In some embodiments, fin dimensions (e.g., fin width, fin length) and fin spacing between the fin structures need not be the same between any two adjacent or non-adjacent fin structures. The fin length employed may depend on a desired channel length and/or fin numbers. In one or more implementations, the fin structure may be cut to form shorter fin structures. At higher voltage, wider material 110 and longer gates 130 are used in some embodiments.

The substrate 105 may be, or may include, semiconductor material such as silicon, silicon-germanium, and gallium-arsenide. In one or more implementations, the fin structures may be formed as part of an STI process. For example, the STI process may involve forming STI regions (material 110, 111, and 112) in the substrate 105. The STI process for forming the material 110 forms the gap 132 between the portions 102a-d and 103a-d in some embodiments. The gap 132 is 80-110 nm is wide in some embodiments. The fin height is around 40-50 nanometer and an STI depth for material 111 and 112 is approximately 60-100 nanometer. The finFET device 100 can be surrounded by material 111 and 112 and material 111 and 112 can be disposed between the fins 101a-d. The material 110 is approximately 200 nm deep in some embodiments. Other dimensions are possible.

The well regions (e.g., the well region 115 and the well region 205) are patterned and formed in an operation 310. The well regions 115 and 205 may be formed by applying dopants (e.g., via ion implantation) to the substrate 105. The dopant type and doping concentration of the well regions 115 and 205 may be tuned to meet specifications (e.g., cost, performance, etc.) for a resulting finFET device (e.g., the finFET device 100) and are formed by ion implantation or using doped epitaxial materials. In some embodiments, the well regions 115 and 114 may be tuned to fit a thermal voltage $V_t$ requirement.

In an operation 315, dummy gate material is patterned and deposited onto the substrate 105 (e.g., the surface 185 of the substrate 105), including the fin structures, (e.g., the fins 101a-d). The dummy gate material may include polysilicon. The gate material may be utilized to form metal structures of the gate 130 of fins 101a-d. The gate 130 may straddle or surround multiple fin structures. Spacers, such as the spacers 208, 182, 184, 198, 1162, and 218, are provided after the dummy gate in a deposit and etch back process in some embodiments.

In an operation 322, the sources 104a-d and the drains 107a-d are doped by performing lithography to open regions of the fin structures. The epitaxial regions 143, 147, and 149 are formed in the opened regions in an operation 324, with dopants incorporated in the epitaxial materials that are grown. The epitaxial materials may be silicon or silicon-germanium with dopants incorporated in the silicon or silicon-germanium. In some embodiments, ion implantation may be performed to increase the doping concentration of the epitaxial regions 143, 147, and 149. In some embodiments, the epitaxial regions 143, 147, and 149 may be formed by epitaxial growth, drive-in anneal, and/or ion implantation. A depth (e.g., vertical direction) of the epitaxial regions 143, 147, and 149 may be tuned based on, for instance, doping concentration in the epitaxy and ion implantation. A length of the epitaxial regions 143, 147, and 149 may be controlled through lithography.

In some embodiments, the dummy gate materials are removed and replaced in an operation 325. The gate 130 may straddle or surround multiple fin structures. In one or more implementations, the gate 130 may be formed by removing dummy material, depositing a dielectric material. An oxide material, such as silicon dioxide, may exist under the metal structures and form a part of the respective gates. In some embodiments, the oxide material is deposited prior to depositing the gate material and can be a high K gate dielectric.

The gate 130 includes spacers 182, 184 and 198 which can be formed when spacers 208, 184, 198, 162, and 218 are formed (e.g. in the operation 315). The gate 130 includes the gate conductor 196 which is asymmetric with respect to the gate conductor 152 for a more shallow drain. The gate 130 includes two fingers (gate conductors 152 and 186) in some embodiments.

In some embodiments, one or more layers of dielectric material is deposited above the trench structures and the gate 130 followed by a via and contact formation operation.

In some embodiments, the subject technology allows for double gate finFET devices that include a super junction LDMOS structure with multiple alternating regions of n- and p-type doped semiconductor. The alternating regions may facilitate depletion of a region at a relatively low voltage and may result in a high breakdown voltage. One or more drift regions (e.g., n-type channel, n-type portion of a fin structure) may be depleted by one or more adjacent p-type regions (e.g., a p-type well region, a p-type portion of a fin structure). Breakdown voltage may be increased through such depletion. In one or more implementations, the subject technology allows for smaller devices that may be operated at higher voltages and may have lower on-resistance. The finFET devices, such as the finFET device 100, may be utilized in power amplifiers, radio frequency (RF) circuits, among other devices.

It is noted that dimensional aspects (e.g., gate width, thickness, fin height, fin length, regions sizes) provided above are examples and that other values for the dimensions may be utilized in accordance with one or more implementations. Furthermore, the dimensional aspects provided above are generally nominal values. As would be appreciated by a person skilled in the art, each dimensional aspect, such as an oxide thickness, has a tolerance associated with the dimensional aspect. For example, in terms of an oxide thickness, the tolerance can be a function of the process utilized in depositing or growing the oxide.

As used herein, the "gate" refers to an insulated gate terminal of a FET. The physical structure of the gate terminal is referred to as a gate electrode. "Source/drain (S/D) terminals" refer to the terminals of a FET between which conduction occurs under the influence of an electric field subsequent to inversion of the semiconductor surface under the influence of an electric field resulting from a voltage applied to the gate terminal of the FET. Designers may designate a particular source/drain terminal to be a "source" or a "drain" on the basis of the voltage to be applied to that terminal when the FET is operated in a circuit.

As used herein, the terms "contact" and "via" both refer to structures in a chip used for electrical connection of conductors from different interconnect levels of the chip. These terms can describe both an opening in an insulator in which the structure will be completed as well as the completed structure itself. For purposes of this disclosure, both contact and via refer to the completed structure.

As used herein, the terms "substrate" and "substrate material" refer to the physical object that is the basic work piece transformed by various process operations into the desired microelectronic configuration. A typical substrate used for the manufacture of integrated circuits is a wafer. Wafers may be made of semiconducting (e.g., bulk silicon), non-semiconducting (e.g., glass), or combinations of semi-conducting and non-semiconducting materials (e.g., silicon-on-insulator (SOI)). In the semiconductor industry, a bulk silicon wafer is commonly used for the manufacture of integrated circuits.

In the semiconductor industry environment of foundries and fabless companies, the foundries develop, specify, and provide the physical structures that designers use to implement their designs. Foundries provide manufacturing services to many fabless semiconductor companies, but to operate profitably they optimize their manufacturing processes to achieve high yields. Such optimizations generally require that limitations be placed on the variety of structures that can be produced by a particular manufacturing process. Consistent with the foregoing, foundries typically provide a limited set of transistor structures that are intended to cover a broad range of circuit applications.

The predicate words "configured to" and "operable to" do not imply any particular tangible or intangible modification of a subject, but, rather, are intended to be used interchangeably. Terms such as "top", "bottom", "front", "rear", "side", "horizontal", "vertical", and the like refer to an arbitrary frame of reference, rather than to the ordinary gravitational frame of reference. Thus, such a term may extend upwardly, downwardly, diagonally, or horizontally in a gravitational frame of reference.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

Any implementation described herein as an "example" is not necessarily to be construed as preferred or advantageous over other implementations. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A fin-based field effect transistor (finFET) device, comprising:
   a substrate material having a first surface and a bottom surface;
   a first fin structure disposed above the first surface of the substrate material, wherein the first fin structure comprises a first portion and a second portion, the first portion being separated from the second portion by a trench reaching the first surface;
   at least one gate structure comprising a first gate conductor disposed over at least two surfaces of the first portion and a second gate conductor disposed at least two surfaces of the second portion;
   a first drain/source region disposed in the first portion;
   a second source/drain region disposed in the second portion; and
   a third source/drain region disposed in the second portion.

2. The finFET device of claim 1, further comprising:
   a first epitaxial material is disposed above the first drain/source region and a second epitaxial region;
   a second epitaxial material is disposed above the second source/drain region; and
   a third epitaxial material is disposed above the third source/drain region.

3. The finFET device of claim 1, wherein the first portion is above a first area of the substrate material and wherein the second portion is above a second area of the substrate material, the first area being separated from the second area by a trench isolation structure.

4. The finFET device of claim 1, further comprising:
   a first well region formed in the substrate material and is doped with a first type of dopant; and
   a second well region formed in the substrate material and is doped with a second type of dopant, wherein a border between the first well region and the second well region is below the second portion and the at least one gate structure.

5. The finFET device of claim 4, wherein the first portion is undoped outside of the first drain/source region and the second portion is undoped outside of the second and third source/drain regions.

6. The finFET device of claim 4, wherein the at least one gate structure comprises a first gate structure disposed on the first fin structure, the finFET device further comprising:
   a second gate structure disposed on the first fin structure; and
   a third gate structure disposed on the first fin structure, wherein:
      a first epitaxial material is disposed between the first gate structure and the second gate structure, and
      a second epitaxial material is disposed between the first gate structure and the third gate structure.

7. The finFET device of claim 3, wherein the first portion is separated from the second portion by at least a width of the trench isolation structure.

8. The finFET device of claim 1, further comprising a second fin structure disposed on the first surface of the substrate material, the second fin structure comprising a third portion and a fourth portion, the third portion being separated from the fourth portion;
   a fourth drain/source region disposed in the third portion;
   a fifth source/drain region disposed in the fourth portion and
   a sixth source/drain region disposed in the fourth portion.

9. The finFET device of claim 8, wherein the at least one gate structure comprises a first gate dielectric disposed on the first fin structure above the first portion and a second gate dielectric disposed above the first surface between the first portion and the second portion.

10. The finFET device of claim 4, wherein:
   the first type of dopant is an p-type dopant and the second type of dopant is an n-type dopant, and
   the first portion is adjacent to the second portion; and
   the first drain/source region and the second and third source/drain regions are doped with the p-type dopant.

11. A fin-based field effect transistor (finFET) device, comprising:
   a semiconductor substrate material, wherein the semiconductor substrate material has a first surface and a bottom surface;
   a first fin structure disposed on the first surface of the semiconductor substrate material, the first fin structure comprising a first drain/source region disposed in a first end portion of the first fin structure, a second source/drain region disposed in a second end portion of the first fin structure, and a third source/drain region disposed in the second end portion, the first end portion being separated from the second end portion by a trench reaching the first surface;
   at least one non-dummy gate structure comprising a first gate conductor disposed over at least two surfaces of the first end portion at the trench and a second gate conductor disposed at least two surfaces of the second end portion at the trench, the two surfaces of the first end portion including a first wall of the trench and the two surfaces of the second end portion including a second wall of the trench;

a first epitaxial material disposed over the first drain/source region;

a second epitaxial material disposed over the second source/drain region; and a third epitaxial material disposed over the third source/drain region.

12. The finFET device of claim 11, further comprising:
a trench isolation structure disposed in the semiconductor substrate material between the first end portion and the second end portion.

13. The finFET device of claim 12, wherein:
the first epitaxial material is configured to be coupled to a source contact, and
the second epitaxial material and the third epitaxial material are configured to be coupled to a drain contact.

14. A fin-based field effect transistor (finFET) device, comprising:
a semiconductor substrate material, wherein the semiconductor substrate material has a first surface and a bottom surface;
a first fin structure disposed on the first surface of the semiconductor substrate material, the first fin structure comprising a first drain/source region disposed in a first end portion of the first fin structure, a second source/drain region disposed in a second end portion of the first fin structure, and a third source/drain region disposed in the second end portion;
at least one gate structure disposed over at least part of the first fin structure at a location closer to the first end portion than the second end portion;
a first epitaxial material disposed over the first drain/source region;
a second epitaxial material disposed over the second source/drain region; and
a third epitaxial material disposed over the third source/drain region;
wherein a first well region is formed in the semiconductor substrate material and is doped with a first type of dopant; and
wherein a second well region is formed in the substrate material and is doped with a second type of dopant, wherein a border between the first well region and the second well region is below the gate structure.

15. The finFET device of claim 14, wherein current travels for the first drain/source region in the first end portion across the border to the second and third source/drain regions in the second end portion in response to a bias on the gate structure.

16. The finFET device of claim 14, further comprising a trench isolation region disposed in the semiconductor substrate material between the first end portion and the second end portion and closer to the second source/drain region than the first drain/source region.

17. The finFET device of claim 16, wherein at least one of the at least one gate structure comprises a high K gate dielectric material and a low resistance metal disposed above the high K gate dielectric material.

18. A method of fabricating a fin-based field effect transistor (finFET) device, comprising:
providing a fin structure above a substrate having a first surface, wherein the fin structure comprises a first portion and a second portion, the first portion being separated from the second portion;
providing a trench between the first portion and the second portion, the trench reaching the first surface;
providing at least one gate structure comprising a first gate conductor disposed over at least two surfaces of the first portion including a surface at a wall of the trench and a second gate conductor disposed at least two surfaces of the second portion at the trench;
providing a first drain/source region in the first portion;
providing a second source/drain region in the second portion; and
providing a third source/drain region in the second portion.

19. The method of claim 18, further comprising:
providing a first well region formed in the substrate doped with a first type of dopant; and
providing a second well region formed in the substrate doped with a second type of dopant.

20. A method of fabricating a fin-based field effect transistor (finFET) device, comprising:
providing a fin structure above a substrate having a first surface, wherein the fin structure comprises a first portion and a second portion, the first portion being separated from the second portion;
providing a first drain/source region in the first portion;
providing a second source/drain region in the second portion;
providing a third source/drain region in the second portion;
providing a first well region formed in the substrate doped with a first type of dopant;
providing a second well region formed in the substrate doped with a second type of dopant;
providing isolation material in a trench in the substrate between the first portion and the second portion.

* * * * *